United States Patent
Iwasaki et al.

(10) Patent No.: US 8,030,827 B2
(45) Date of Patent: Oct. 4, 2011

(54) CRYSTAL UNIT

(75) Inventors: Takahiko Iwasaki, Saitama (JP); Kouichi Hara, Saitama (JP); Shigeru Obara, Saitama (JP)

(73) Assignee: Nihon Dempa Kogyo Co., Ltd. (JP)

( * ) Notice: Subject to any disclaimer, the term of this patent is extended or adjusted under 35 U.S.C. 154(b) by 75 days.

(21) Appl. No.: 12/367,034

(22) Filed: Feb. 6, 2009

(65) Prior Publication Data
US 2009/0195126 A1 Aug. 6, 2009

(30) Foreign Application Priority Data
Feb. 6, 2008 (JP) .................. 2008-026220

(51) Int. Cl.
*H03H 9/05* (2006.01)
(52) U.S. Cl. ...................................... 310/353
(58) Field of Classification Search .............. 310/346, 310/351–355, 344, 348; *H03H 9/05, 9/04*
See application file for complete search history.

(56) References Cited

U.S. PATENT DOCUMENTS

| | | | | |
|---|---|---|---|---|
| 4,136,297 A | * | 1/1979 | Briese | 310/353 |
| 4,267,479 A | * | 5/1981 | Kato | 310/348 |
| 4,859,898 A | * | 8/1989 | Aubry et al. | 310/353 |
| 7,011,887 B2 | | 3/2006 | Obara et al. | |

FOREIGN PATENT DOCUMENTS

| | | |
|---|---|---|
| JP | 53-57777 | 5/1978 |
| JP | 08-008684 A | 1/1996 |
| JP | 11-308067 | 11/1999 |
| JP | 2001-127576 * | 5/2001 |
| JP | 2001-160730 A | 6/2001 |
| JP | 2001-345672 A | 12/2001 |
| JP | 2002-261566 A | 9/2002 |

OTHER PUBLICATIONS

Japanese Office Action for Japanese Patent Application No. 2008-026220 dispatched Apr. 20, 2010 with partial English translation.

* cited by examiner

*Primary Examiner* — Thomas Dougherty
*Assistant Examiner* — Karen B Addison
(74) *Attorney, Agent, or Firm* — Cantor Colburn LLP

(57) ABSTRACT

In a crystal unit, at least two places of an outer circumference of a quartz crystal blank, which are places that correspond to both ends of a stress sensitivity zero axis of the crystal blank, are supported by supporters and fixed to the supporters by conductive adhesives. Each supporter includes; a vertical portion with a surface extending vertically, a slit formed in the vertical portion as extending vertically and with both ends thereof being closed, and a tongue portion projecting from a lower end of the slit. Each conductive adhesive includes; a first portion formed between the tongue portion and a lower surface of the crystal blank, a second portion extending to an end face of the crystal blank from an outer surface of the supporter and through the slit, and a third portion formed between an inner surface of the supporter and an upper surface of the crystal blank.

6 Claims, 6 Drawing Sheets

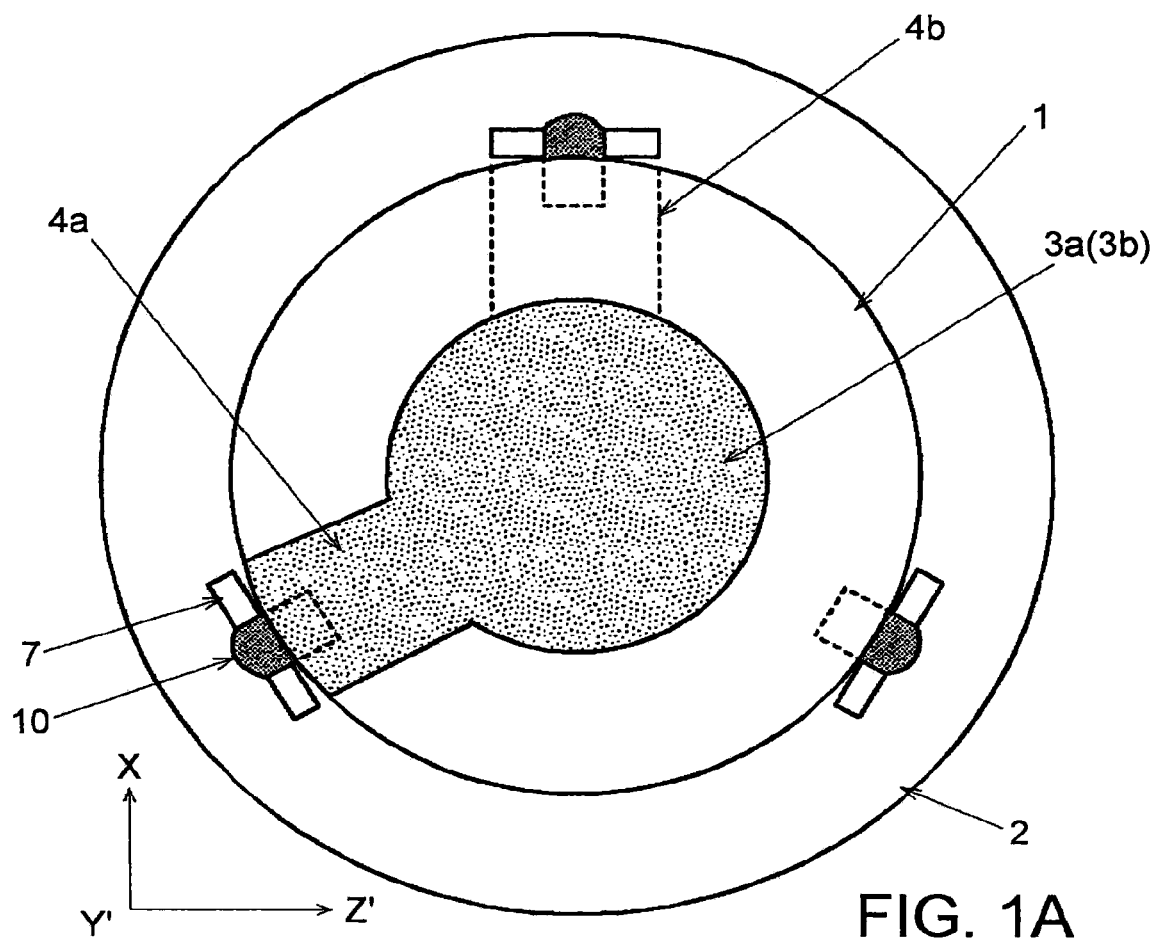
FIG. 1A
(Background Art)
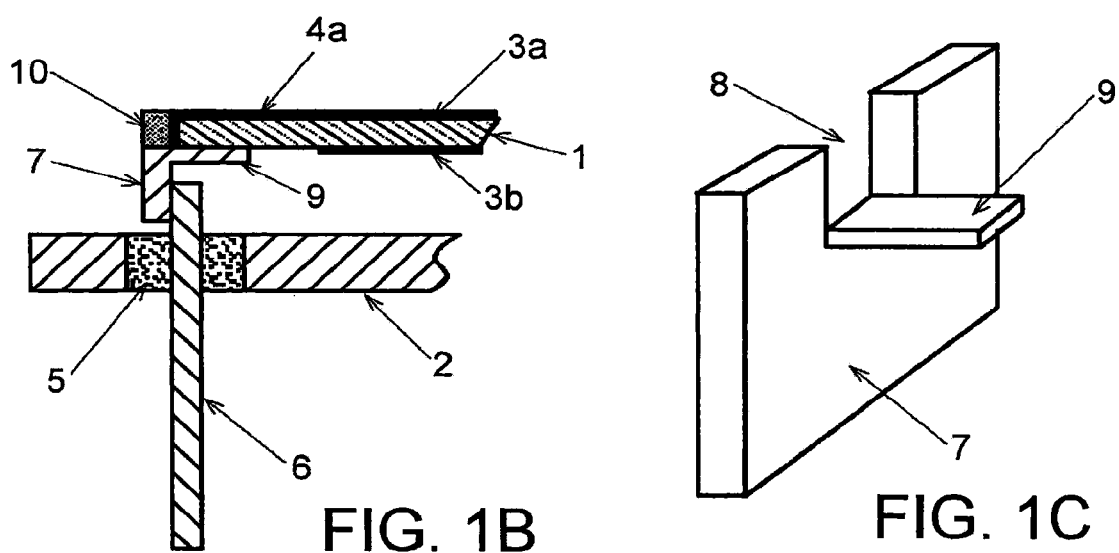
FIG. 1B
(Background Art)
FIG. 1C
(Background Art)

CRYSTAL UNIT

BACKGROUND OF THE INVENTION

1. Field of the Invention

The present invention relates to a quartz crystal unit with high stability, which uses a quartz crystal blank such as an SC-cut crystal blank, an IT-cut crystal blank, an AT-cut crystal blank, or the like. In particular, the present invention relates to a holding structure for a crystal blank in the crystal unit in which supporters are used.

2. Description of the Related Arts

A crystal unit having a structure in which a quartz crystal blank is hermetically encapsulated inside a container is highly stable in terms of its vibration frequency. Such crystal units are being used as frequency sources for radio devices at base stations in communication networks, for instance. A crystal blank that configures such a crystal unit can be categorized into several types of "cut" based on the crystallographic orientation in cutting out a crystal blank from a single crystal of quartz. Typical types that are known, for example, are X-cut, AT-cut, BT-cut, and so forth. With respect to a crystal of quartz, three crystal axes that are X-axis, Y-axis and Z-axis are crystallographically defined.

In order to retain the frequency stability of the crystal unit, with high precision particularly, without the crystal unit being influenced by the ambient temperature, a kind of a mechanism which could heat the crystal blank by a heater and keep the temperature of the crystal at a certain temperature is used. The crystal unit, of which temperature is kept at a certain temperature by a heater or the like, is used in an oscillator of a communication device, such as a device for a radio base station, for instance. As a crystal unit to be used for that purpose, there is a kind that holds a crystal blank of a type such as an SC-cut, IT-cut or AT-cut in a horizontal direction with respect to a metal base, the crystal blank being hermetically encapsulated inside a container composed of the metal base and a metal cover.

FIG. 1A is a plane view showing one configuration example of a conventional crystal unit in which a crystal blank in the crystal unit is kept in a horizontal direction with respect to a metal base. FIG. 1A shows the manner of holding the crystal blank in a state without a metal cover. FIG. 1B is a partial sectional view showing a part of the crystal unit that holds the crystal blank. FIG. 1C is a perspective view of a supporter used in the crystal unit. Details of the structure of the crystal unit shown in these figures are described in Japanese Patent Laid-Open No. 11-308067 (JP-A-11-308067), for instance.

In this crystal unit, crystal blank 1, of a disk-like shape for instance, is supported over metal base 2 through lead wires 6 and supporters 7. Lead wires and supporters 7 will be described later. Crystal blank 1 is hermetically housed inside a space between metal base 2 and a metal cover (not shown) while the metal cover is applied over metal base 2. Metal base 2 also has a disk-like shape.

Crystal blank 1 is an AT-cut quartz crystal blank, for instance, and includes excitation electrodes 3a, 3b of approximately circular shapes at central portions of both principal surfaces thereof, respectively. Extraction electrodes 4a, 4b extend from excitation electrodes 3a, 3b, respectively, toward an outer circumference of crystal blank 1. Here, an extending direction of extraction electrode 4a and an extending direction of extraction electrode 4b are apart by 120 degrees when seen from a center of crystal blank 1. Extraction electrodes 4a, 4b having been extracted to two parts of the outer circumference of crystal blank 1 further extend to an end face of crystal blank 1. The AT-cut crystal blank, considering X-, Y'- and Z'-axes of the crystal of quartz which are derived by rotating the three axes (i.e., X-, Y- and Z-axes) by 35 degrees with respect to the X-axis, will be a crystal blank having a principal surface which is a plane formed by X-axis and Z'-axis. The AT-cut crystal blank vibrates in a thickness-shear vibration mode.

At metal base 2, three lead wires 6 are arranged equally at 120-degree intervals when seen from a center of metal base 2, and these lead wires 6 are arranged in a way penetrating through metal base 2. Metal base 2 are provided with through-holes at the positions where respective lead wires 6 are penetrating through. Lead wire 6 is inserted to each of the through-holes. As shown in FIG. 1B, a space between lead wire 6 and metal base 2 in each through-hole is filled with glass 5, whereby each through-hole is hermetically sealed and lead wire 6 is electrically insulated from metal base 2. In this way, lead wire 6 and glass 5 form an airtight terminal at each through-hole.

To an apical end of each lead wire 6, supporter 7 as shown in FIG. 1C is connected. Supporter 7 is made with metal and has a tabular shape. A plate surface of supporter 7 extends perpendicularly with respect to metal base 2. Each supporter 7 is provided with slit 8 and tongue portion 9. Slit 8 is formed as being opened upwardly in an upper end thereof. Tongue portion 9 is formed at a lower end of slit 8 in a way bending at a right angle and extending perpendicularly with respect to the plate surface of supporter 7.

Crystal blank 1 is mounted on tongue portions 9 of supporters 7, at two places in the outer circumference of crystal blank 1 where extraction electrodes 4a, 4b are extended to, and at another different place in the outer circumference of crystal blank 1 which is apart from each of the other two places by 120 degrees, which makes a total of three places in the outer circumference of crystal blank 1. Thereby, over metal base 2, crystal blank 1 is held in a way such that the main surface of crystal blank 1 is parallel to metal base 2. Here, the end face of crystal blank 1 is to contact closely to slits 8 at respective positions of supporters 7. A concave portion formed by a lower end surface and both side surfaces of each slit 8 is to be filled with conductive adhesive 10, whereby crystal blank 1 is fixed to each of supporters 7 through conductive adhesive 10.

Such a crystal unit with high stability is to be mounted on a wiring board along with circuit elements composing an oscillation circuit and with other elements, and heated by a heater structure (not shown) to be maintained at a certain temperature. By maintaining the crystal unit at a certain temperature, the vibration frequency of the crystal unit will exhibit extremely high stability. More specifically, the amount of change in the vibration frequency will be kept to 1 ppb (i.e., one part per billion) or less, for instance. The wiring board with the crystal unit mounted thereon in the above-described manner can be placed inside a cassette, for instance, to be set in communication equipment used in a radio base station.

In the above-described crystal unit, crystal blank 1 with a disk-like shape is held at three points by supporters 7 being arranged equally at 120-degree intervals. In geometry, a plane is to be specified by three points that are not in the same straight line. With this in consideration, the above-described structure of the crystal unit can hold the crystal blank with little shakiness and most stably in geometric perspective. Accordingly, with respect to the holding system of the crystal blank, little deformation is caused even when possible impact strikes from outside. With this crystal unit, it is possible to maintain a good vibration characteristic with the crystal blank. Moreover, due to conductive adhesive 10 that fills inside of the concave portion of each slit 8, it is only the end face of crystal blank 1 that is to be connected with supporters 7 at the positions where supporters 7 are arranged. It is possible to keep the contact areas of supporters 7 with respect to crystal blank 1 small, whereby dissipation of vibration energy from crystal blank 1 toward supporters 7 can be kept small. Thus, desired vibration intensity can be obtained at crystal blank 1.

In the above-described configuration of the crystal unit, an equally-spaced three-point holding structure, which is geometrically most stable, is used However, crystal blank 1 is fixed to each supporter 7 through a little amount of conductive adhesive 10 that fills inside of the concave portion of slit 8 which is formed in each supporter 7 as being opened in the upper end. With this crystal unit, there is a problem in that the crystal unit will be greatly influenced by an impact that could strike at a time when a cassette containing the crystal unit is to be set in a communication device, or the like. More specifically, when impact from outside strikes the crystal unit, the holding state of crystal blank 1 by conductive adhesive 10 will change, which could result in changing the vibration frequency of crystal blank 1. This indicates that a stability of frequency with respect to the crystal unit is not good against impact.

In this case, conductive adhesive 10 at each supporter 7 is connected only with the outer circumference end face of crystal blank 1 at the concave portion inside slit 8. Therefore, when a comparatively large impact, such as an impact by a large earthquake, for example, strikes the crystal unit, there is a possibility that conductive adhesive 10 exfoliates from crystal blank 1. The crystal unit with possible exfoliation of the conductive adhesive may not be positively sufficient in terms of its use in a radio base station that requires high stability. With respect to a crystal unit with high stability, frequency change over 1 ppb (ire., one part per billion) with respect to the original vibration frequency is considered as a problem. Therefore, for the crystal unit with high stability, not only the vibration characteristic under static condition, but also an impact resistance characteristic taking in the perspective of possible exfoliation, etc. is considered significant.

As a background art of the present invention, Japanese Patent Laid-Open No. 2002-261566 (JP-A-2002-261566) discloses a crystal unit in which a crystal blank is held by fixing an end face of the crystal blank to supporters by metal brazing, while the supporters are provided with slits but not with tongue portions. Japanese Utility Model Laid-Open No. 53-57777 (JP-U-53-057777) discloses a crystal unit that uses supporters with slits, an upper end portion of each slit being closed.

SUMMARY OF THE INVENTION

It is an object of the present invention to provide a crystal unit which is capable of achieving enhanced fixation strength of a crystal blank using conductive adhesive and reducing change in vibration frequency, whereby excellent impact resistance characteristic and aging characteristic can be achieved, and thus high frequency stability in the crystal unit can be achieved.

A crystal unit according to the present invention is a kind in that at least two places of an outer circumference of a crystal blank, which are places that correspond to both ends of a stress sensitivity zero axis of the crystal blank, are supported by supporters with slits of which upper ends are closed, and the crystal blank is fixed to these supporters by conductive adhesives. The conductive adhesive is applied to not only on an end face of the crystal blank exposing at a position of the slit, but also in between an under surface of the crystal blank and a tongue portion of the supporter, and in between an upper surface of the crystal blank and an inner surface of the supporter. Thereby, the fixation strength of the crystal blank using conductive adhesive can be enhanced.

In one aspect of the present invention, a crystal unit includes: a metal base; at least two lead wires electrically insulated from the metal base and penetrating through the metal base; supporters connecting to apical ends of the lead wires, respectively; and a crystal blank supported by the supporters. Each supporter includes: a vertical portion with a surface extending in a vertical direction with respect to a principal surface of the metal base; a slit formed in the vertical portion as extending in the vertical direction, both ends of the slit being closed; and a tongue portion projecting from a lower end of the slit. The crystal blank includes: a pair of excitation electrodes formed on both principal surfaces thereof, respectively; and a pair of extraction electrodes extending from the excitation electrodes, respectively, along a stress sensitivity zero axis of the crystal blank toward two places of an outer circumference of the crystal blank. The stress sensitivity zero axis is an axis direction where change in vibration frequency of the crystal blank with respect to stress will be at a minimum. The crystal blank is placed on the tongue portions of the supporters at the outer circumference thereof where at least the pair of extraction electrodes are extended to such that the crystal blank is held by the supporters over the metal base in such a way as to become parallel with the principal surface of the metal base. The crystal blank is fixed to the supporters by conductive adhesives. Each conductive adhesive includes: a first portion formed between the tongue portion and an under surface of the crystal blank; a second portion extending to an end face of the crystal blank from an outer surface of the supporter and through the slit; and a third portion formed between an inner surface of the supporter and an upper surface of the crystal blank.

In this configuration, supporters each of which has a tongue portion protruding from a lower end of a slit are used and the upper surface, the under surface and the end face of the crystal blank are fixed to the supporters by the first to third portions of the conductive adhesives. Accordingly, the fixation strength of the crystal blank with respect to the supporters can be enhanced, whereby the holding state of the crystal blank by the supporters can be maintained in good condition, even in such cases where possible impact strikes the crystal unit. The crystal unit maintains good vibration characteristics including crystal impedance (CI).

Since the positions at which the crystal blank is fixed to the supporters by the conductive adhesives correspond to both ends of the stress sensitivity zero axis, it is possible to keep the change in the vibration frequency of the crystal blank to a minimum even if stress is caused by contraction of the conductive adhesives at the time of their heat hardening. Moreover, even if the stress against the crystal blank changes due to changes in the conductive adhesives with the passage of time or due to possible impact applied, change in the vibration frequency can be prevented because the stress that can be caused by contraction of the conductive adhesives at the time of their heat hardening has little influence on the vibration frequency of the crystal blank. According to the present invention, it is possible to provide a crystal unit with excellent impact resistance characteristic and aging characteristic.

BRIEF DESCRIPTION OF THE DRAWINGS

FIG. 1A is a plane view showing a configuration of one example of a conventional crystal unit, the crystal unit being in a state without a cover;

FIG. 1B is a sectional view of main parts of the crystal unit shown in FIG. 1A;

FIG. 1C is a perspective view of a supporter;

DETAILED DESCRIPTION OF THE PREFERRED EMBODIMENTS

Figure 2A:
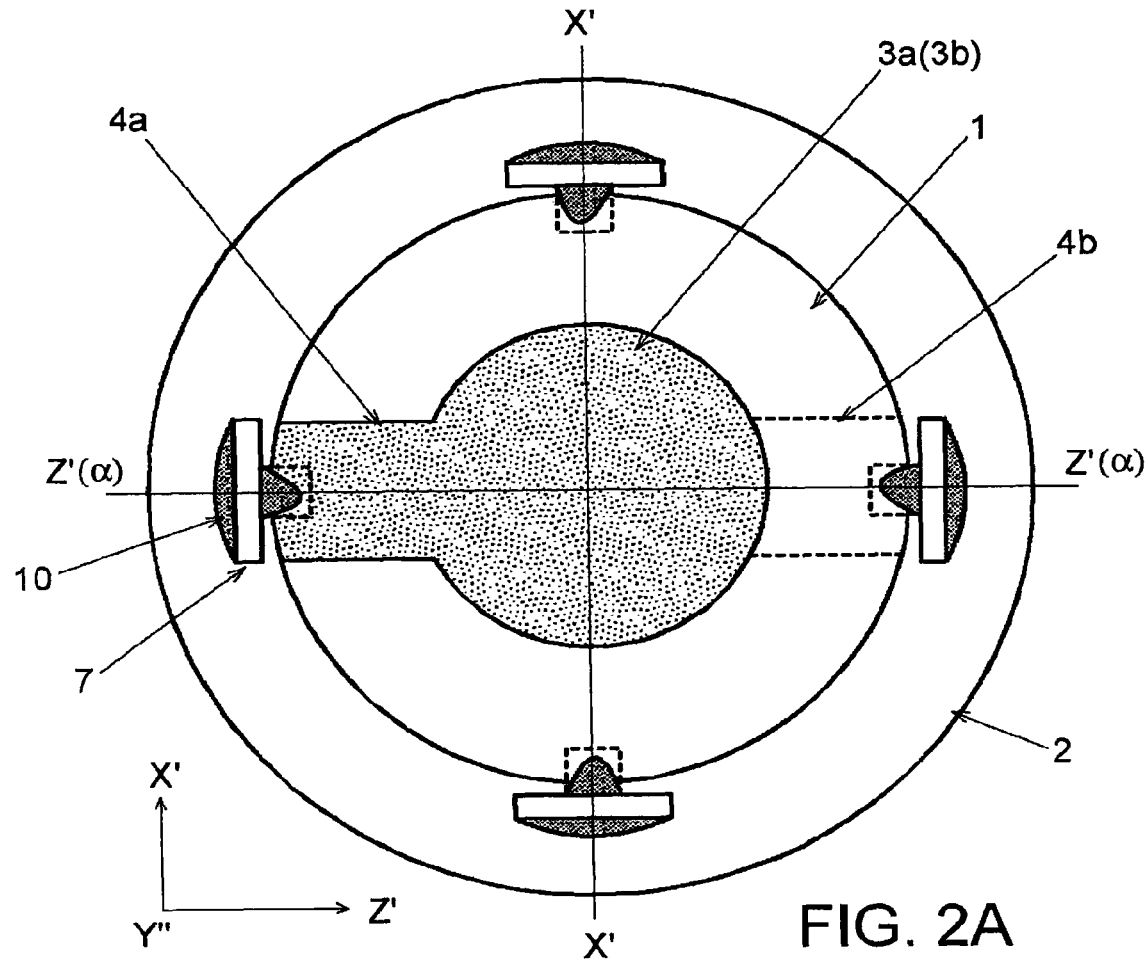
FIG. 2A is a plan view showing a configuration of a crystal unit according to one exemplary embodiment, the crystal unit being in a state without a cover.

With respect to FIGS. 2A to 2C and 3A to 3C showing a quartz crystal unit according to one exemplary embodiment of the present invention, the same reference numerals as used in FIGS. 1A to 1C are used for referring to the same constituent elements as those in FIGS. 1A to 1C, and redundant descriptions with respect to them will be omitted.

Figure 2B:
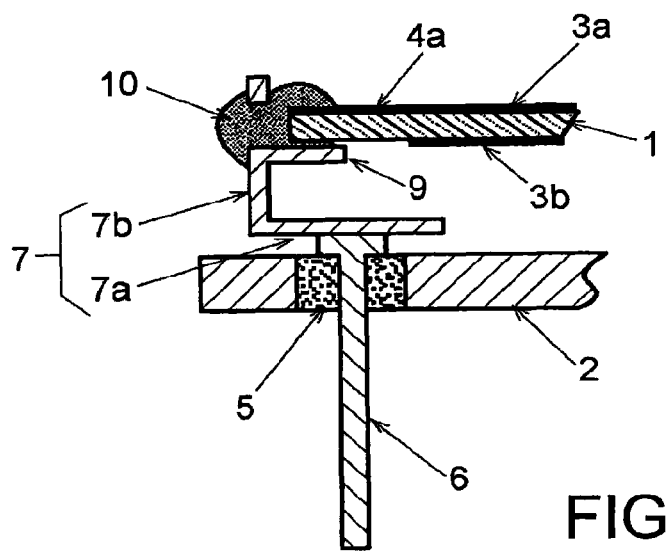
FIG. 2B is a sectional view of main parts of the crystal unit shown in FIG. 2A.

The crystal unit of the present exemplary embodiment is similar to the one described above. As shown in FIGS. 2A and 2B, in the crystal unit of the present exemplary embodiment, four lead wires 6 are provided in a way penetrating through metal base 2, and supporters 7 are connected to apical ends of lead wires 6, respectively. A circumference portion of crystal blank 1 is supported by these supporters 7. Crystal blank 1 with a disk-like shape is held in a way such that a principal surface thereof is parallel to metal base 2. Conductive adhesives 10 are used in fixing crystal blank 1 to supporters 7. As conductive adhesive 10, a kind of adhesive which is thermosetting, produces little gas while hardening or after being hardened, and has little influence on a vibration characteristic of crystal blank 1 is to be used. A conductive adhesive which satisfies such conditions may be a kind that includes polyimide as a main component of a resin component, for instance.

Metal base 2 has a disk-like shape. At metal base 2, through-holes are formed at four positions that equally divide a circumference of a concentric circle which shares the same center with metal base 2. Lead wire 6 is inserted to each of the four through-holes. In this way, at metal base 2, four lead wires 6 are arranged equally at 90-degree intervals when seen from the center of metal base 2, which makes two pairs of supporters 7, each facing each other. Each lead wire 6 is electrically insulated from metal base 2 by glass 5 that fills inside of each through-hole. Thus, lead wire 6 and glass 5 form an airtight terminal at each through-hole.

In the following description, among two principal surfaces of metal base 2, the one that faces crystal blank 1 is referred to as an "inner bottom surface."

A head part of each lead wire 6, that is, an apical end of each lead wire 6 that is to hold crystal blank 1, is shaped into a small disk-like shape like a nail head. Such lead wire 6 is protruding from the inner bottom surface of metal base 2, and thus forms a shape that exhibits a T-shape at cross section. The head part of each lead wire 6 is firmly attached to on glass 5 that seals the through-hole. A diameter of the small disk-like shaped head part of each lead wire 6 is smaller than a diameter of a formation region of glass 5; and by such arrangement, electrical connection between lead wire 6 and metal base 2 is prevented.

Figure 3A:
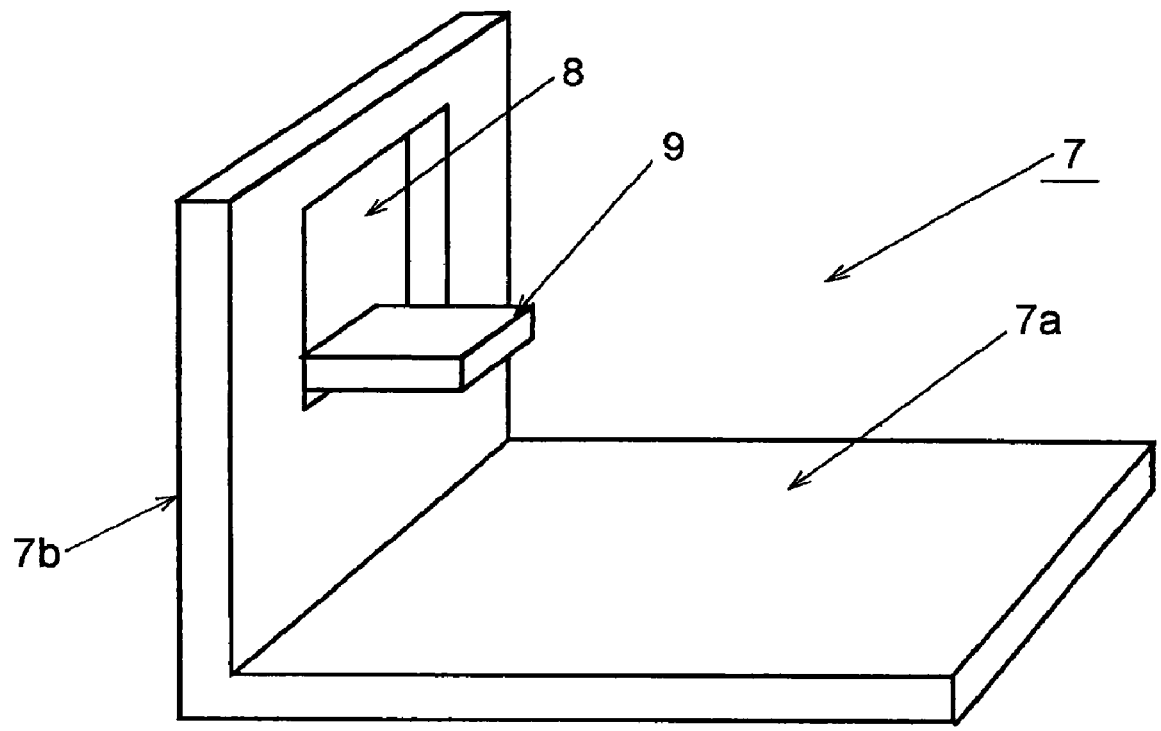
FIG. 3A is a perspective view of a supporter of the crystal unit shown in FIG. 2A.
Figure 3B:
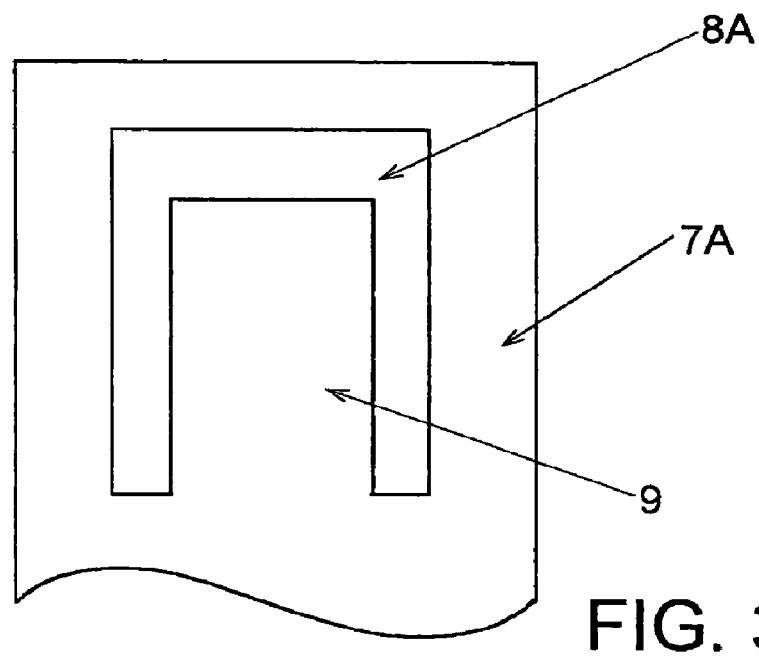
FIG. 3B is a partial plan view of the supporter shown in FIG. 3A.

Each supporter 7 is made with metal and has a shape that exhibits an L-shape at cross section. Horizontal portion 7a of each supporter 7 is bonded to the head part of lead wire 6 by spot welding. At vertical portion 7b of each supporter 7, slit 8 is formed. As shown in FIG. 3A, slit 8 is formed as a space that penetrates between both surfaces of supporter 7 at vertical portion 7b, and as extending in a vertical direction of supporter 7. An upper end of slit 8 is not opened upwardly as a lower end of slit 8 is not opened downwardly either. Tongue portion 9 is formed at the lower end of slit 8 in a way bending at a right angle and projecting horizontally. As shown in FIG. 3B, for example, such slit 8 and tongue portion 9 can be formed by first forming U-shaped incision 8A in tabular metal plate 7A by etching, and then bending a portion surrounded by incision 8A, which is to become tongue portion 9, at right angle with respect to metal plate 7A. Incision 8A is to be formed in a region of slit 8 except for a region which is to become tongue portion 9, and in a way that the lower end side of slit 8 will remain. According to such a method of forming tongue portion 9, a projecting length of tongue portion 9 will be shorter than a length of slit 8, and a width of tongue portion 9 will be smaller than a width of slit 8. Suitable values for such lengths and widths can be determined at the time of forming incision 8A by etching.

Supporters 7 are arranged in a way such that horizontal portions 7a of respective supporters 7 are aligned in a radial direction of metal base 2, and such that ends of respective supporters 7 where vertical portions 7b are formed are facing toward the outer circumference of metal base 2. By adjusting a length of horizontal portion 7a of each supporter 7 and a bonding position of each horizontal portion 7a with the head portion of each lead wire 6, it is possible to change a distance between vertical portions 7b of supporters 7 that face each other on metal base 2, as desired. Thereby, it is possible to adjust the distance between the vertical portions 7b of facing supporters 7 to comply with a size, ie., a diameter, of crystal blank 1.

As one specific example, a length and a width of vertical portion 7b of supporter 7 can be 1.6 mm, a length of slit 8 can be 0.9 mm, a width of slit 8 can be 0.8 mm, and a projecting length and a width of tongue portion 9 can be 0.6 mm. It is preferable that supporter 7 can be commonly used for different crystal blanks 1 with different vibration frequencies. A length between an upper end of vertical portion 7b and a lower end of slit 8 is to be determined based on a thickness of a crystal blank with the lowest vibration frequency so that supporter 7 can be commonly used among crystal blanks with vibration frequencies ranging from 5 MHz to 7 MHz, for example. With a crystal blank in the thickness-shear vibration mode, a vibration frequency will be inversely proportional to a thickness of the crystal blank.

As crystal blank 1, it is possible to use an AT-cut quartz crystal blank as in the above-described case. In this case, however, it is preferable that an SC-cut quartz crystal blank which has good thermal shock resistance and stress sensitivity characteristic is used. Now, the SC-cut crystal blank will be described. The SC-cut crystal blank is formed from a so-called double-rotation Y-cut quartz crystal plate which is formed by cutting out a piece from a crystal of quartz along a plane derived by first rotating a crystal plane vertical to Y-axis in the quartz crystal around X-axis, and then rotating the plane around Z-axis. Therefore, the SC-cut crystal blank, considering X'-, Y"- and Z'-axes of the crystal derived by double-rotating X-, Y- and Z-axes in a way described above, will be a crystal blank with a principal surface being a plane formed by X'-axis and Z'-axis More specifically, the principal surface of the SC-cut crystal blank can be obtained by first rotating a crystal plane vertical to Y-axis in the quartz crystal around X-axis by about 22 degrees, and then rotating the plane around Z-axis by 34 degrees. The SC-cut crystal blank vibrates in a thickness-shear vibration mode.

In the SC-cut crystal blank, an axis, which is parallel to the principal surface of the SC-cut crystal blank and which is rotated by 8 degrees from the crystal axis Z', and an axis which is orthogonal to the axis just mentioned will be stress sensitivity zero axes. The stress sensitivity zero axis indicates an axis in which frequency change becomes a minimum value including zero when stress is applied to crystal blank 1 from both ends of crystal blank 1 along that axis. Directions of the stress sensitivity zero axes can be obtained based on a direction of Z'-axis. Therefore, the SC-cut crystal blank generally has a notch portion at one end in the Z-axis direction for identifying the axis direction. In the following description, the stress sensitivity zero axis derived by rotating Z'-axis by 8 degrees will be represented by Z'($\alpha$).

Approximately circular shaped excitation electrodes 3a, 3b are arranged on central portions of the both principal surfaces of crystal blank 1, respectively. Extraction electrodes 4a, 4b extend from excitation electrodes 3a, 3b, respectively, toward the outer circumference of crystal blank 1. Extraction electrodes 4a, 4b extend in directions opposite from each other along the stress sensitivity zero axis Z'($\alpha$) which is an axis derived by rotating Z' axis of SC-cut crystal blank 1 by 8 degrees. In crystal blank 1, extraction electrodes 4a, 4b are formed only on the principal surfaces of crystal blank 1 where corresponding excitation electrodes 3a, 3b are formed. In other words, at the end face of the outer circumference of crystal blank 1, the extraction electrodes are not being extended and the end face of the whole outer circumference of crystal blank 1 is exposed.

Crystal blank 1 is placed on tongue portions 9 of respective supporters 7 at both ends of the two stress sensitivity zero axes, respectively, the two stress sensitivity zero axes which are orthogonal to each other. Crystal blank 1 is fixed to supporters 7 by conductive adhesives 10. Thereby, crystal blank 1 is supported over metal base 2 in a way that the principal surface of crystal blank 1 is parallel to metal base 2. At this point, a pair of supporters 7 positioned at both ends of the one stress sensitivity zero axes Z'($\alpha$), is electrically connected with extraction electrodes 4a, 4b. Accordingly, lead wires 6 connected with this pair of supporters 7 are electrically connected with excitation electrodes 3a, 3b of crystal blank 1. The remaining two lead wires 6 are not electrically connected with the excitation electrodes.

Figure 3C:
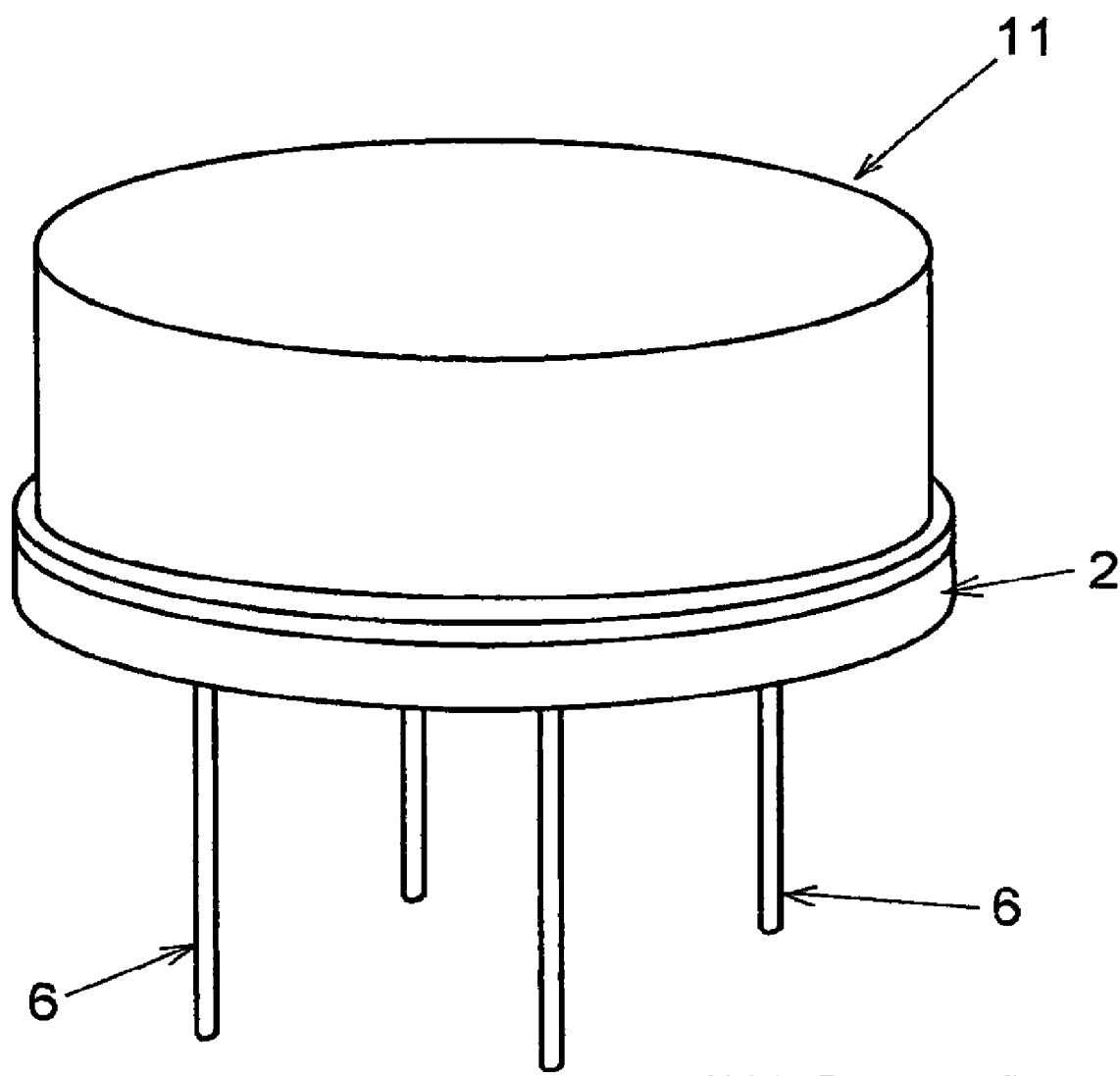
FIG. 3C is a entire perspective view of the crystal unit shown in FIG. 2A.

After having crystal blank 1 being supported over metal base 2 in the above-described way, metal base 2 is covered with metal cover 11 which has a cylindrical shape and is closed at one end thereof. Thereby, crystal blank 1 is hermetically encapsulated inside a space surrounded by metal base 2 and metal cover 11. In this way, the crystal unit shown in FIG. 3C is completed.

Next, processes of fixing crystal blank 1 to supporters 7 will be described.

Figure 4A:
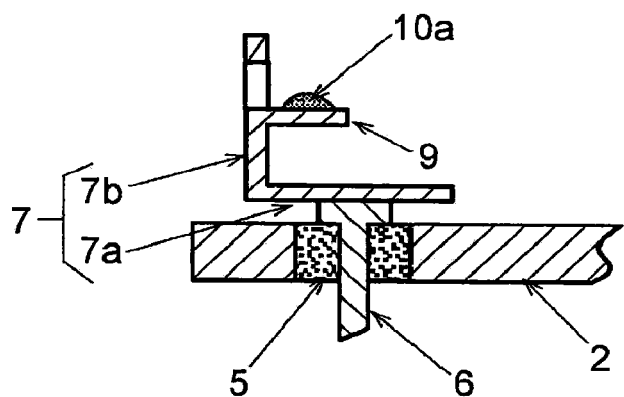
FIGS. 4A to 4D are sectional views showing manufacturing processes of the crystal unit shown in FIG. 2A in sequence.
Figure 4B:
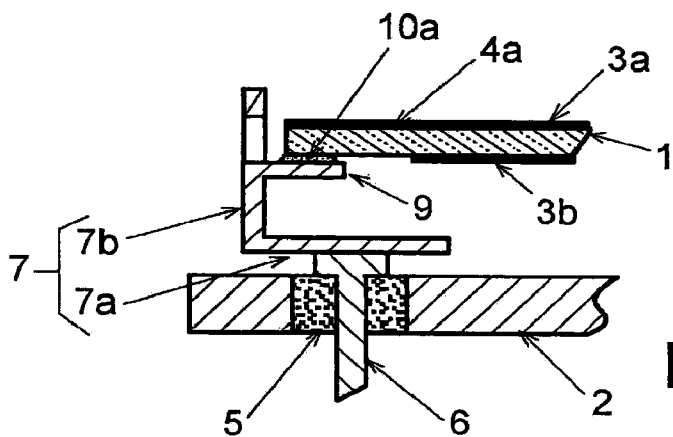

In a first step, first conductive adhesives 10a in liquid phases before being hardened or cured by heat are applied by drops on tongue portions 9 of respective supporters 7 as shown in FIG. 4A. Next, as shown in FIG. 4B, under surfaces of four places in the outer circumference of crystal blank 1, which correspond to both ends of respective stress sensitivity zero axes which are orthogonal to each other, are placed on first conductive adhesives 10a. In this way, the four places in the outer circumference of crystal blank 1, which will be the positions of both ends of respective stress sensitivity zero axes, are located initially. At this point, the end face of crystal blank 1 is not touching an inner surface of each supporter 7 or both inner ridges of each slit 8.

Figure 4C:
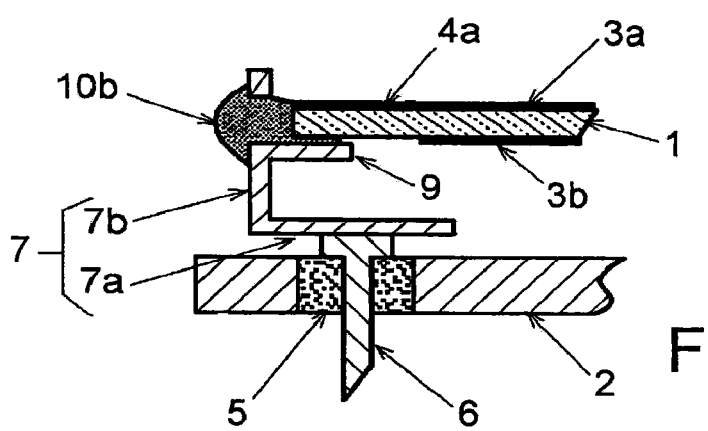

Next, in a second step, as shown in FIG. 4C, second conductive adhesive 10b is applied on the outer surface of vertical portion 7b and through slit 8 at each supporter 7. Thereby, second conductive adhesive 10b is applied on the outer surface of vertical portion 7b of supporter 7, on an inner surface of slit 8, and on the end face of crystal blank 1. Here, the outer surface of vertical portion 7b is one of the two principal surfaces of vertical portion 7b from which tongue portion 9 is not projecting. Second conductive adhesive 10b as applied is combined with first conductive adhesive having been applied in the first step.

Figure 4D:
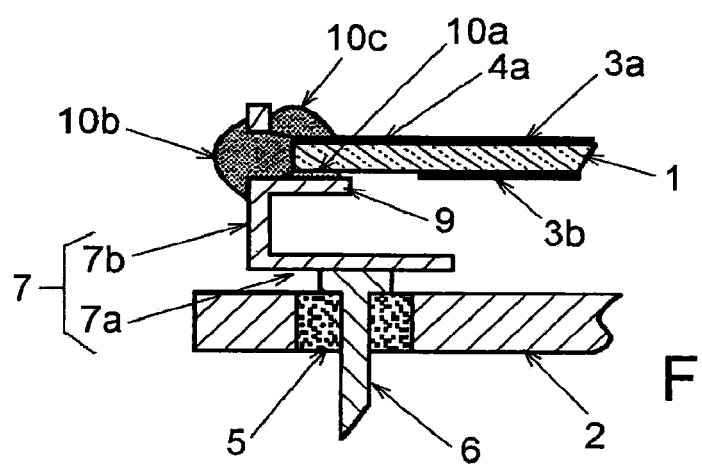

Next, in a third step, as shown in FIG. 4D, third conductive adhesive 10c is applied in between a part of the inner surface of vertical portion 7b up from the upper end position of slit 8 and the upper surface of crystal blank 1. Third conductive adhesive 10c as applied is combined with second conductive adhesive 10b having been applied inside slit 8 in the second step. Thereby, first to third conductive adhesives 10a to 10c are unified into conductive adhesive 10 while these conductive adhesives are still in liquid phase. Lastly, by heating unified conductive adhesive 10 to harden, the four places of the outer circumference of crystal blank 1 are fixed to supporters 7. In this case, the application process of the conductive adhesive is divided into three steps using first to third conductive adhesives 10a to 10c, respectively. Of course, first to third conductive adhesives 10a to 10c applied at respective steps can be conductive adhesives of the same kind.

Through such processes, at each of the four places of the outer circumference of crystal blank 1, the under surface of crystal blank 1 is fixed to tongue portion 9, the upper surface of crystal blank 1 is fixed to the inner surface of vertical portion 7b, and the end face of crystal blank 1 is fixed to the outer surface of supporter 7 and to the inner surface of slit 8, by conductive adhesives 10a to 10c applied at respective steps. As compared to the conventional crystal unit in which only the end face of the crystal blank is fixed to the supporters, the crystal unit of the present exemplary embodiment exhibits enhanced fixation strength between crystal blank 1 and supporters 7.

The fixation strength can be further enhanced due to using the SC-cut crystal blank as crystal blank 1 and fixing the crystal blank to the supporters at the four places of the outer circumference of the crystal blank, which correspond to the positions of both ends of the respective two stress sensitivity zero axes bisecting each other at right angles. Even if stress is caused by contraction of conductive adhesive 10 at the time of its hardening by heat, it is possible to keep the influence of the stress on the vibration frequency to a minimum since both ends of the respective stress sensitivity zero axes are at fixed positions. Moreover, even if the fixation strength of conductive adhesive 10 is reduced over time and the stress applied to the crystal blank changes, influences of such changes that have on the vibration frequency will be small.

In the present exemplary embodiment, the length (0.6 mm) and the width (0.6 mm) of tongue portion 9 are smaller than the length (0.9 mm) and the width (0.8 mm) of slit 8. By making each tongue portion 9 shorter in this manner, the contact position of crystal blank 1 with respect to tongue portion 9 will become apart from the vibrating region of crystal blank 1, whereby it is possible to reduce the influence that the fixation of crystal blank 1 to supporters 7 could have on the vibration characteristic. The length of slit 8, as mentioned earlier, is determined based on the thickness of the crystal blank with the lowest vibration frequency, among the crystal blanks applicable to the crystal unit. Therefore, in a case of using crystal blank 1 with high vibration frequency, i.e., in a case of using thin crystal blank 1, the ratio of the length of tongue portion 9 with respect to the thickness of the crystal blank will increase. Accordingly, in the present exemplary embodiment, the length of tongue portion 9 is made shorter than the length of slit 8.

By making the width of tongue portion 9 smaller, the fixation area between conductive adhesive 10 and crystal blank 1 over tongue portion 9 can be reduced. Thereby, it is possible to achieve excellent aging characteristic of the crystal unit.

Figure 5:
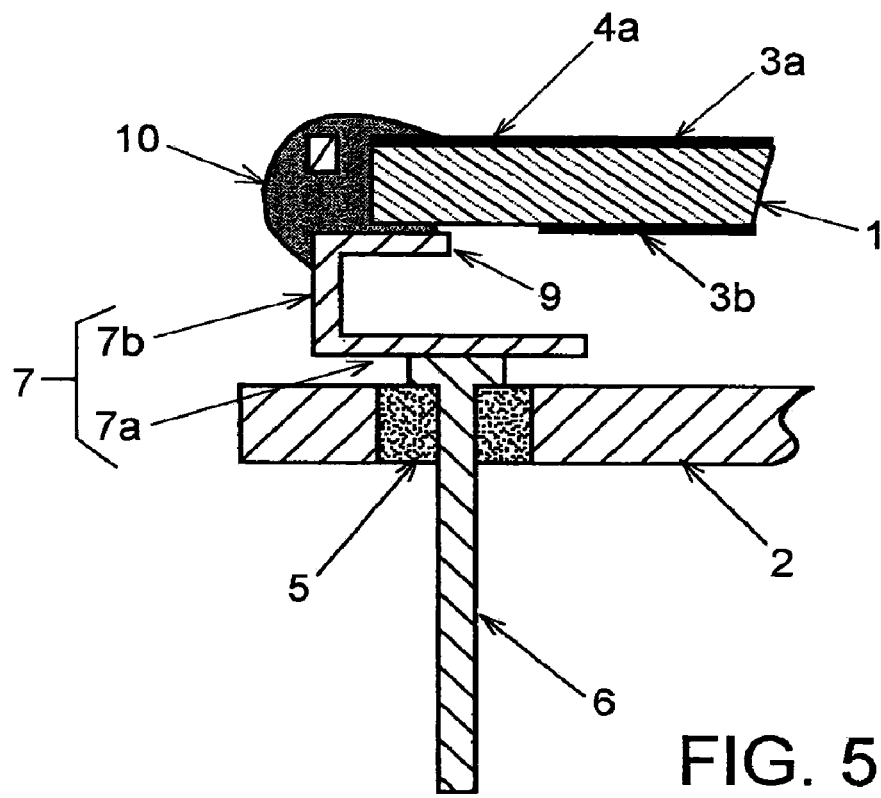
FIG. 5 is a sectional view of main parts of a crystal unit showing another example of a coating state of conductive adhesive.

In addition, in a case that the height of vertical portion 7b of supporter 7 and the thickness of crystal blank 1 are about the same, conductive adhesive 10 can be applied over the upper surface of crystal blank 1 toward the outer surface of vertical portion 7b, as in a case shown in FIG. 5, for example.

Figure 6:
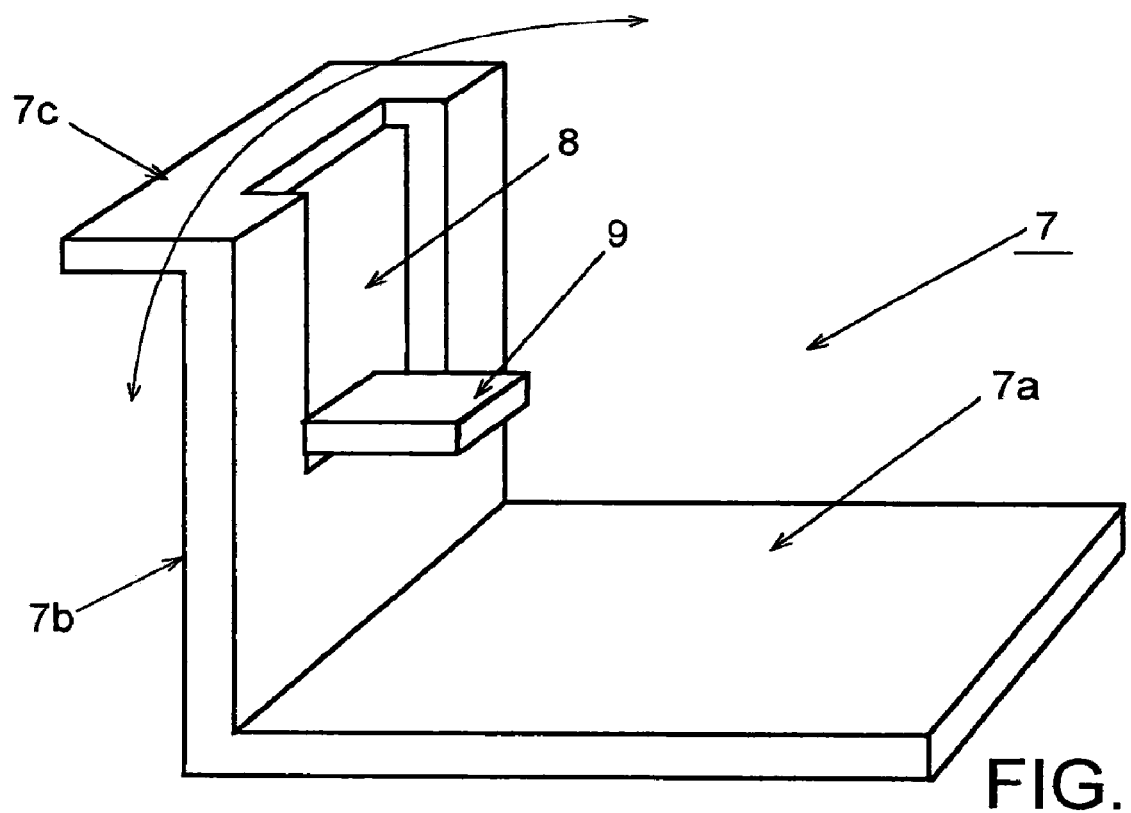
FIG. 6 is a perspective view of a supporter of a crystal unit according to a further exemplary embodiment.

In the above-described exemplary embodiment, each supporter 7 has an L-shape at cross section, and the apical end of vertical portion 7b thereof extends vertically. However, according to the present invention, it is also possible to additionally arrange bending portion 7c which may be formed by bending the apical end of vertical portion 7b at-supporter 7 outwardly or inwardly, as shown in FIG. 6. By arranging such bending portion 7c, stiffness of supporter 7 can be enhanced, whereby mechanical deformation of supporter 7 due to possible impact can be prevented. Such mechanical deformation of supporter 7, for example, could be bending of supporter 7 in an inward direction as shown by an arrow in FIG. 6. In using such supporter 7, no stress will be caused due to mechanical deformation of supporter 7, whereby the impact resistance of the crystal unit can be improved.

In the above description, each supporter 7 has an L-shape at cross section. However, according to the present invention, it is also possible to use a supporter as the one shown in FIG. 1C which is formed from the vertical portion only. Moreover, although all four of lead wires 6 are formed as airtight terminals, it is possible that at least two of lead wires 6 that connect with extraction electrodes 4a, 4b are rendered airtight terminals. In such case, the other two lead wires 6 do not need the through-holes and can be arranged directly on the inner bottom surface of metal base 2, for these lead wires 6 will not take parts in the electrical connections with crystal blank 1.

In a case when the shape of the crystal blank is rendered a long and thin rectangular shape, for instance, it is not necessary to hold the crystal blank at four places of the circumference thereof, while the crystal blank can be held at two places at both ends of the crystal blank where the extraction electrodes are made to extend to.

According to the present invention, it is also possible to use a crystal blank other than the SC-cut type. For instance, in using an AT-cut crystal blank, a crystal unit can be configured such that the crystal blank is held at two places at both ends of the stress sensitivity zero axis of the crystal blank.

Furthermore, in a case of using a crystal blank formed from a double-rotation Y-cut quartz crystal plate, it is possible to configure the crystal unit in such a way that the crystal blank is held at four places of the outer circumference of the crystal blank, because there are stress sensitivity zero axes that intersect each other in two directions. As a crystal blank formed from the double-rotation Y-cut quartz crystal plate, other than the SC-cut crystal blank, an IT-cut quartz crystal blank as disclosed in U.S. Pat. No. 7,011,887 can be used, for example. A principle surface of the IT-cut crystal blank is a plane that can be obtained by first rotating a crystal plane vertical to Y-axis in the quartz crystal around X-axis by about 19 degrees, and then rotating the plane around Z-axis by 33 degrees With the IT-cut crystal blank, two stress sensitivity zero axes are bisecting each other at right angles at a plane of the crystal blank. Specifically, Z'-axis having been rotated in a direction of X'-axis by 18 degrees and an axis that is orthogonal to this axis are to be the stress sensitivity zero axes.

What is claimed is:

1. A crystal unit comprising:
   a metal base;
   at least two lead wires electrically insulated from the metal base and penetrating through the metal base;
   supporters connecting to apical ends of the lead wires, respectively; and
   a crystal blank supported by the supporters,
   each of said supporters comprising:
      a vertical portion with a surface extending in a vertical direction with respect to a principal surface of the metal base;
      a slit formed in the vertical portion as extending in the vertical direction, both ends of the slit being closed;
      a tongue portion projecting from a lower end of the slit; and
      a bending portion formed by bending an apical end of the vertical portion such that the bending portion extends from the vertical portion in a direction opposite to a projecting direction of the tongue portion from the vertical direction;
   the crystal blank comprising:
      a pair of excitation electrodes formed on both principal surfaces thereof, respectively; and
      a pair of extraction electrodes extending from the excitation electrodes, respectively, along a stress sensitivity zero axis of the crystal blank toward two places of an outer circumference of the crystal blank,
   wherein the stress sensitivity zero axis is an axis direction where change in vibration frequency of the crystal blank with respect to stress will be at a minimum,
   wherein the crystal blank is placed on the tongue portions of the supporters at the outer circumference thereof where at least the pair of extraction electrodes are extended to such that the crystal blank is held by the supporters over the metal base in such a way as to become parallel with the principal surface of the metal base, and the crystal blank is fixed to the supporters by conductive adhesives, and
   wherein each of said conductive adhesives includes: a first portion formed between the tongue portion and a lower surface of the crystal blank; a second portion extending to an end face of the crystal blank from an outer surface of the supporter and through the slit; and a third portion formed between an inner surface of the supporter and an upper surface of the crystal blank.

2. The crystal unit according to claim 1, further comprising four of the supporters, wherein
   the crystal blank is formed from a double rotated Y-cut quartz crystal plate with two stress sensitivity zero axes that bisect each other at right angles, and the crystal blank is fixed to supporters at four places of the outer circumference of the crystal blank which are places that correspond to both ends of respective two stress sensitivity zero axes.

3. The crystal unit according to claim 2, wherein the crystal blank is an SC-cut crystal blank.

4. The crystal unit according to claim 2, wherein the crystal blank is an IT-cut crystal blank.

5. The crystal unit according to claim 1, wherein the first portion, the second portion and the third portion are unified.

6. The crystal unit according to claim 1, wherein
each of the extraction electrodes is formed only on the principal surface of the crystal blank where the corresponding excitation electrode is formed, whereby an outer circumference end face of the crystal blank is exposed entirely, and
the first portion and the second portion are combined.

* * * * *